United States Patent [19]
Long et al.

[11] Patent Number: 5,013,398
[45] Date of Patent: May 7, 1991

[54] ANISOTROPIC ETCH METHOD FOR A SANDWICH STRUCTURE

[75] Inventors: Paul D. Long, Meridian; Jose J. Guerricabeitia, Boise, both of Id.

[73] Assignee: Micron Technology, Inc., Boise, Id.

[21] Appl. No.: 530,139

[22] Filed: May 29, 1990

[51] Int. Cl.$^5$ .................. H01L 21/306; B44C 1/22; C03C 15/00; C23F 1/02
[52] U.S. Cl. .................. 156/643; 156/646; 156/651; 156/653; 156/656; 156/657; 156/659.1; 156/662; 204/192.37; 252/79.1; 437/228; 437/233; 437/238; 437/241
[58] Field of Search .............. 156/643, 646, 651, 653, 156/656, 657, 659.1, 662; 252/79.1; 204/192.32, 192.37; 437/40, 41, 42, 43, 228, 233, 238, 241

[56] References Cited

U.S. PATENT DOCUMENTS

| | | | |
|---|---|---|---|
| 4,424,621 | 1/1984 | Abbas et al. | 156/653 X |
| 4,521,448 | 6/1985 | Sasaki | 437/41 X |
| 4,528,066 | 7/1985 | Merkling et al. | 252/79.1 X |
| 4,818,334 | 4/1989 | Shwartzman et al. | 252/79.1 X |
| 4,869,781 | 9/1989 | Euen et al. | 156/653 X |
| 4,965,219 | 10/1990 | Cerofolini | 437/41 X |

*Primary Examiner*—William A. Powell
*Attorney, Agent, or Firm*—Susan B. Collier; Stanley N. Protigal; Angus C. Fox, III

[57] ABSTRACT

A plasma etch process to anisotropically etch a sandwich structure of silicon dioxide, polycrystalline silicon, and silicon dioxide "in situ", that is, in a single etch chamber. The silicon dioxide is etched using a $SF_6/CHF_3/He$ chemistry. The polycrystalline silicon is etched using a $HBr/He$ chemistry. A non-erodible cathode is used. Tungsten silicide may replace the polycrystalline silicon. Silicon nitride may replace the silicon dioxide.

17 Claims, 2 Drawing Sheets

ANISOTROPIC ETCH METHOD FOR A SANDWICH STRUCTURE

BACKGROUND OF THE INVENTION

This invention relates to etching methods used in the fabrication of integrated electronic circuits on a semiconductor substrate such as silicon, particularly a single-chamber (in situ) method of anisotropically plasma etching a sandwich structure of a silicon oxide over polycrystalline silicon over a gate oxide.

An electronic circuit is chemically and physically integrated into a substrate such as a silicon wafer by patterning regions in the substrate, and by patterning layers on the substrate. These regions and layers can be conductive, for conductor and resistor fabrication, or insulative, for insulator and capacitor fabrication. They can also be of differing conductivity types, which is essential for transistor and diode fabrication. Degrees of resistance, capacitance, and conductivity are controllable, as are the physical dimensions and locations of the patterned regions and layers, making circuit integration possible. Fabrication can be quite complex and time consuming, and therefore expensive. It is thus a continuing quest of those in the semiconductor fabrication business to reduce fabrication times and costs of such devices in order to increase profits. Any simplified processing step or combination of processes at a single location becomes a competitive advantage.

A common requirement in integrated circuit (IC) fabrication is the etching of a "sandwich" structure such as shown in FIG. 1A, having a layer of silicon dioxide ("oxide") over a layer of polycrystalline silicon ("poly") over a layer of thin oxide (often called "gate oxide", because of its frequent use in transistor gates). Oxide is an insulator with dielectric properties. Poly is resistive in nature, but is made less resistive when doped with an element having less or more than 4 valence electrons, such as phosphorus.

Two basic types of etch techniques can be used: chemical or "wet", and plasma or "dry". Etch chemistries for oxide and for poly are well known. Ordinarily, a mask layer is first deposited on a layer to be etched, and a mask opening made in the mask layer by photolithographic means, exposing a portion of the layer to be etched. An appropriate etch technique and chemistry is employed, which acts only on the exposed portion.

Difficulties may arise when more than one layer is desired etched at a single site because of different requirements for each: an etch chemistry for the bottom layer may interfere with a layer already etched through and exposed along the sidewall. Often these difficulties require changes between wet and dry techniques, and different types of etchers.

It is desirable to etch multiple layers at a single processing site. Less handling of the IC is required, which reduces handling errors. Less masking steps may also be required, which directly reduces fabrication costs.

Both oxide and poly can be etched in a single parallel plate plasma reactor chamber. However, an oxide is typically etched in fluorine deficient fluorocarbon based plasmas, whereas poly is often etched in fluorine or chlorine based plasmas. Reactor electrode materials may also differ: for oxide etch, an erodible electrode such as graphite or silicon is often used to provide a source of carbon or silicon for etch selectivity, whereas for poly etch, a non-erodible electrode is preferred.

If a single-chamber process were attempted using conventional art to etch an oxide/poly sandwich structure, the erodible electrode required for oxide etch would be destroyed by the poly etchants. Using conventional methods, the two steps are not profitably compatible.

It is desirable to etch an oxide/poly/oxide sandwich such as shown in FIG. 1A, "in situ", that is, performing all required steps within a single etch chamber, using a common electrode.

SUMMARY OF THE INVENTION

In summary, the inventive process is as follows. A silicon wafer having an oxide/poly/oxide sandwich structure, coated with a resist mask, is transferred into the chamber of a parallel plate plasma reactor, having a non-erodible cathode such as anodized aluminum.

The total inventive process includes five steps.

Step 1: Oxide etch, selective to poly, using a $SF_6/CHF_3$/He chemistry.

Step 2: Oxide overetch, using the same chemistry as Step 1. Poly profile begins to prograde.

Step 3: Timed etch to counteract poly prograde, using a HBr/He chemistry.

Step 4: Poly etch, selective to oxide, using the same chemistry as Step 3, but in different ratios.

Step 5: Poly overetch, using the same chemistry as Step 4. The overall profile of the entire sandwich structure is smoothed.

Naturally, when one atmosphere is purged and another is introduced, a gas stability step is provided to guarantee a stable new atmosphere. These are well known to those familiar with this type of equipment and will not be further detailed.

The entire process, including gas stability steps, takes about 4-5 minutes for a structure having 450 nm oxide and 550 nm poly.

BRIEF DESCRIPTION OF THE DRAWINGS

The inventive method is easier to understand when these drawings are referred to.

DETAILED DESCRIPTION OF THE PREFERRED EMBODIMENT

Figure 1A:
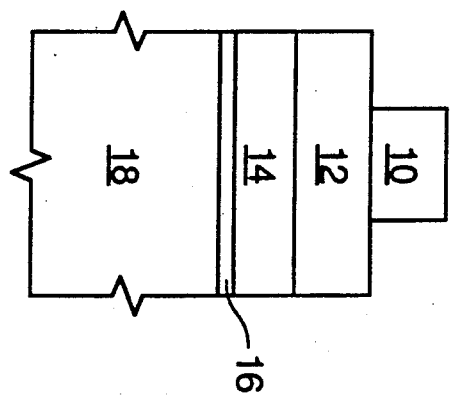
FIG. 1A illustrates a sample oxide/poly/oxide sandwich structure to be etched, having a patterned resist mask.

As illustrated in FIG. 1A, a photoresist mask layer 10 is aligned and developed on a sandwich structure of oxide 12, poly 14, and gate oxide 16, on a silicon wafer substrate 18. Deposition and masking of this structure are done by methods well known to those skilled in semiconductor design and processing, and hence are not fully disclosed herein.

The preferred embodiment of the inventive method is well-suited for 450 nm of oxide 12, 550 nm of poly 14, and 35 nm of gate oxide 16.

The wafer having the masked structure is transferred into the chamber of a Tegal 1511e Plasma Reactor, made by Tegal Corp. of Petaluna, Calif., fitted to have a cathode of a material such as anodized aluminum, which is non-erodible in plasma.

Preferred recipes are now described which embodies the invention.

Figure 1B:
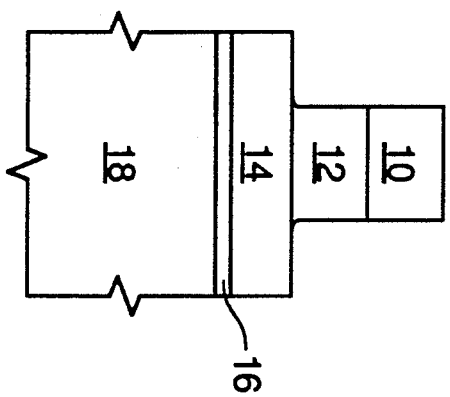
FIG. 1B shows results of oxide etch.

Recipe for Step 1, oxide etch, selective to poly, resulting in the structure of FIG. 1B:

5 sccm±20% $SF_6$,
90 sccm±20% $CHF_3$, and
60 sccm±20% He, in a
400±50 W plasma, at
500±100 mTorr,
endpointing on poly.

A critical ratio in Step 1 is $CHF_3:SF_6$, which is preferably within 16:1 to 22:1. Helium is believed to assist uniformity in this etch. "Sccm" is a flow measurement of standard cubic centimeters per minute.

Figure 1C:
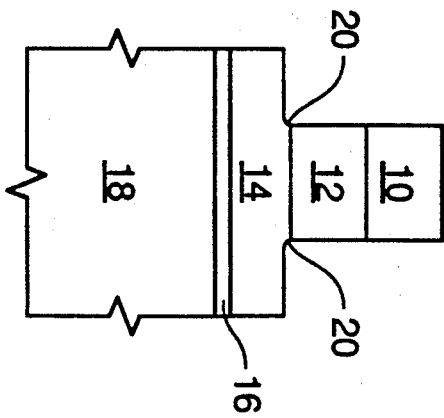
FIG. 1C shows the structure after oxide overetch. Poly prograde 20 is shown.

Recipe for Step 2, oxide overetch, resulting in the structure of FIG. 1C:

5 sccm±20% $SF_6$,
90 sccm±20% $CHF_3$, and
60 sccm±20% He, in a
350±50 W plasma, at
500±100 mTorr, for
30±10 s, or until residual oxide gone.

In Steps 1 and 2, He is representative of an inert carrier gas. Poly prograde 20 develops.

Figure 1D:
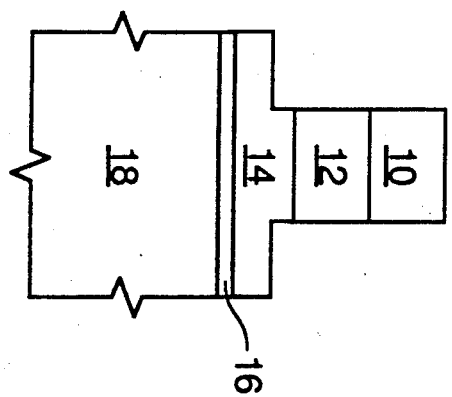
FIG. 1D shows how poly prograde 20 of FIG. 1C is removed after poly prograde etch.

Recipe for Step 3, poly prograde 20 counteraction, resulting in the structure of FIG. 1D:

10 sccm±20% He, and
33.5 sccm±15% HBr, in a
200±20 W plasma, at
200±20 mTorr, for
20±5 s, or until prograde counteracted.

A critical ratio in Step 3 is HBr:He, which is preferably within 3.2:1 to 3.5:1.

Figure 1E:
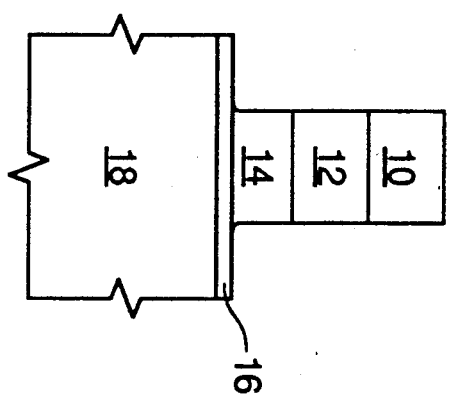
FIG. 1E illustrates the sandwich structure after poly etch.

Recipe for Step 4, poly etch, selective to oxide, resulting in the structure of FIG. 1E:

10 sccm±20% He, and
20 sccm±15% HBr, in a
225±25 W plasma, at
150±15 mTorr,
endpointing on oxide.

A critical ratio in Step 4 is HBr:He, which is preferably within 1.7:1 to 2.3:1.

Figure 1F:
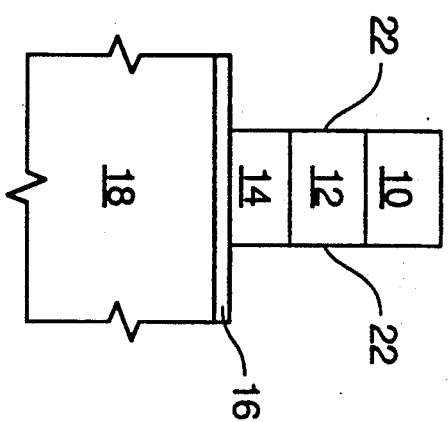
FIG. 1F shows the final sandwich structure, with smooth sidewalls 22, after poly overetch.

Recipe for Step 5, poly overetch, resulting in the structure of FIG. 1F:

10 sccm±20% He, and
20 sccm±15% HBr, in a
150±10 W plasma, at
100±10 mTorr, for
33±10 s, or until poly gone.

In Steps 3-5, He is representative of an inert gas, is believed to mechanically assist the etch, and is considered necessary.

In the preferred configuration, 1 Watt of plasma equivalent to about 5.66 $mW/cm^2$ plasma power density for a 150 mm diameter wafer. This converts to the following approximate plasma power density ratings:

Step 1: 2.3±0.3 $W/cm^2$
Step 2: 2.0±0.3 $W/cm^2$
Step 3: 1.1±0.1 $W/cm^2$
Step 4: 1.3±0.1 $W/cm^2$
Step 5: 0.8±0.1 $W/cm^2$ Temperature is 15°-25° C. for all steps to prevent resist from burning.

If Step 3 is omitted, the structure will end up having a little ridge in the poly sidewall just below the interface between oxide 12 and poly 14.

A poly equivalent in this process is a refractory metal silicide, such as tungsten silicide. Although the structure disclosed included tetraethylorthosilicate (TEOS) derived oxide, BPSG or any silane derived oxide, for example, may be etched. Nitride of silicon is also considered equivalent to oxide for purposes of the inventive process. These equivalents and others are intended to be circumscribed by these claims.

We claim:

1. A method to etch a sandwich structure of a first layer selected from the group of silicon dioxide and silicon nitride, on a second layer selected from the group of polycrystalline silicon and a refractory metal silicide, on a third layer selected from the group of silicon dioxide and silicon nitride, comprising the steps of:

providing a patterned mask layer on the structure, leaving a region of the first layer exposed;
providing a plasma etch reactor having a non-erodible electrode and using it for:
etching the exposed first layer in a first atmosphere of He and 16:1 to 22:1 $CHF_3:SF_6$, in a 2.0 to 2.6 $W/cm^2$ plasma, at 400 to 600 mTorr and 15° to 25° C., until the second layer is exposed and a sidewall is formed in the first layer;
etching the exposed second layer in a second atmosphere of 3.2:1 to 3.5:1 HBr:He, in a 1.0 to 1.2 $W/cm^2$ plasma, at 180 to 220 mTorr and 15° to 25° C., until any prograde in said second layer is counteracted; and
etching the exposed second layer in a third atmosphere of 1.7:1 to 2.3:1 HBr:He, in a 1.2 to 1.4 $W/cm^2$ plasma, at 135 to 165 mTorr and 15° to 25° C., until the third layer is exposed and a sidewall is formed in the second layer.

2. A method according to claim 1, further comprising a final sidewall smoothing etch step in said third atmosphere, in a 0.7 to 0.9 $W/cm^2$ plasma, at 90 to 110 mTorr and 15° to 25° C.

3. A method to etch a sandwich structure of a first layer selected from the group of silicon dioxide and silicon nitride, on a second layer selected from the group of polycrystalline silicon and a refractory metal silicide, on a third layer selected from the group of silicon dioxide and silicon nitride, comprising the steps of:

providing a patterned mask layer on the structure, leaving a region of the first layer exposed;
providing a plasma etch reactor having a non-erodible electrode and using it for:
etching the exposed first layer in a first atmosphere of an inert carrier gas and 16:1 to 22:1 $CHF_3:SF_6$, until the second layer is exposed and a sidewall is formed in the first layer;
etching the exposed second layer in a second atmosphere of 3.2:1 to 3.5:1 HBr:inert assisting gas, until any prograde in said second layer is counteracted; and
etching the exposed second layer in a third atmosphere of 1.7:1 to 2.3:1 HBr:inert assisting gas, until the third layer is exposed and a sidewall is formed in the second layer, and said sidewalls of said first and second layers are smoothed.

4. A method according to claim 3, wherein said inert carrier gas is He.

5. A method according to claim 3, wherein said inert assisting gas is He.

6. A method according to claim 3, wherein said etching in said first atmosphere is performed in a 2.0 to 2.6 W/cm$^2$ plasma, at 400 to 600 mTorr and 15° to 25° C., and includes an overetch step.

7. A method according to claim 3, wherein said etching in said first atmosphere further comprises:
bulk etching, in a 2.0 to 2.6 W/cm$^2$ plasma, at 400 to 600 mTorr and 15° to 25° C.; and
overetching, in a 1.7 to 2.3 W/cm$^2$ plasma, at 400 to 600 mTorr and 15° to 25° C.

8. A method according to claim 3, wherein said etching in said third atmosphere is performed in a 1.2 to 1.4 W/cm$^2$ plasma, at 135 to 165 mTorr and 15° to 25° C., and includes an overetch step.

9. A method according to claim 3, wherein said etching in said third atmosphere further comprises:
bulk etching, in a 1.2 to 1.4 W/cm$^2$ plasma, at 135 to 165 mTorr, and 15° to 25° C.; and
overetching, in a 0.7 to 0.9 W/cm$^2$ plasma, at 90 to 110 mTorr and 15° to 25° C.

10. A method according to claim 3, wherein said etching in said second atmosphere is performed in a 1.0 to 1.2 W/cm$^2$ plasma, at 180 to 220 mTorr and 15° to 25° C.

11. A method to etch a sandwich structure of a first layer selected from the group of silicon dioxide and silicon nitride, on a second layer selected from the group of polycrystalline silicon and a refractory metal silicide, on a third layer selected from the group of silicon dioxide and silicon nitride, comprising the steps of:
providing a patterned mask layer on the structure, leaving a region of the first layer exposed;
providing a plasma etch reactor having a non-erodible electrode and using it for:
etching the exposed first layer in a first atmosphere of an inert carrier gas and 16:1 to 22:1 CHF$_3$:SF$_6$, until the second layer is exposed and a sidewall is formed in the first layer; and
etching the exposed second layer in a second atmosphere of 1.7:1 to 3.5:1 HBr:inert assisting gas, until the third layer is exposed and a sidewall is formed in the second layer, and said sidewalls of the first and second layers are smoothed.

12. A method according to claim 11, wherein said inert carrier gas is He.

13. A method according to claim 11, wherein said inert assisting gas is He.

14. A method according to claim 11, wherein said etching in said first atmosphere uses a 1.7 to 2.6 W/cm$^2$ plasma, at 400 to 600 mTorr and 15° to 25° C.

15. A method according to claim 11, wherein said etching in said first atmosphere includes an overetch step.

16. A method according to claim 11, wherein said etching in said second atmosphere uses a 0.7 to 1.4 W/cm$^2$ plasma, at 90 to 220 mTorr and 15° to 25° C.

17. A method according to claim wherein said etching in said second atmosphere includes an overetch step.

* * * * *

UNITED STATES PATENT AND TRADEMARK OFFICE
CERTIFICATE OF CORRECTION

PATENT NO. : 5,013,398
DATED : May 7, 1991
INVENTOR(S) : Paul D. Long; Jose J. Guerricabeitia It is certified that error appears in the above-indentified patent and that said Letters Patent is hereby corrected as shown below:

Column 3, line 57, before "equivalen," insert --is --;

Column 6, line 29, delete "claim" and insert --claim 11--;

Signed and Sealed this

Twenty-sixth Day of October, 1993

Attest:

BRUCE LEHMAN

Attesting Officer

Commissioner of Patents and Trademarks